(12) United States Patent
Kuhn et al.

(10) Patent No.: US 6,512,788 B1
(45) Date of Patent: Jan. 28, 2003

(54) RF OUTPUT SPECTRUM MEASUREMENT ANALYZER AND METHOD

(75) Inventors: John J Kuhn, Santa Rosa, CA (US); Joseph M. Gorin, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/199,101

(22) Filed: Nov. 24, 1998

Related U.S. Application Data
(60) Provisional application No. 60/106,666, filed on Nov. 2, 1998.

(51) Int. Cl.[7] .......................... H04B 17/00; H04B 3/46; H04Q 1/20
(52) U.S. Cl. ................. 375/224; 324/76.22; 455/226.2; 702/77
(58) Field of Search ................................. 375/224, 227, 375/228, 274; 324/76.21, 76.22; 455/67.3, 226.2, 226.3; 702/76, 77

(56) References Cited

U.S. PATENT DOCUMENTS

| | | | |
|---|---|---|---|
| 4,904,930 A | * 2/1990 | Nicholas | 324/76.21 |
| 5,475,709 A | 12/1995 | Futagami et al. | 375/224 |
| 5,499,391 A | 3/1996 | Tsui | 455/226.2 |
| 5,724,388 A | 3/1998 | Nagano et al. | 375/224 |
| 5,808,463 A | 9/1998 | Nagano | 324/76.21 |
| 6,072,841 A | * 6/2000 | Rahnema | 375/325 |

FOREIGN PATENT DOCUMENTS

| | | | |
|---|---|---|---|
| GB | 2253550 | 9/1992 | G01R/13/34 |
| GB | 2326724 | 12/1998 | G01R/23/165 |

\* cited by examiner

*Primary Examiner*—Chi Pham
*Assistant Examiner*—Phuong Phu

(57) ABSTRACT

The present invention provides an RF spectrum measurement analyzer and method and more particularly to a GSM output RF spectrum measurement analyzer and corresponding method. One preferred embodiment of the present invention is applicable to GSM applications. However, other embodiments could be applicable to the general class of Time Division Multiple Access (TDMA) signals of which GSM, PDC (Pacific Digital Cellular), NADC and the like are a part. According to one preferred embodiment of the present invention, the method includes the steps of acquiring an RF carrier signal; converting the acquired RF carrier signal to an IF signal; converting the IF signal to a digital signal of relatively wide bandwidth; FFT filtering the digital signal to measure multiple offset frequencies within the IF bandwidth; and mathematically applying a resolution bandwidth filter at each offset. A further embodiment includes the steps of inverse FFT filtering the output of the resolution bandwidth filter and measuring the power in the time domain.

9 Claims, 3 Drawing Sheets

RF OUTPUT SPECTRUM MEASUREMENT ANALYZER AND METHOD

This application claims the benefit of Ser. No. 60/106,660, filed Nov. 2, 1998.

BACKGROUND OF THE INVENTION

The present invention relates to an RF spectrum measurement analyzer and method and more particularly to a GSM output RF spectrum measurement analyzer and corresponding method.

GSM, or Global System for Mobile Communications, is a worldwide standard for digital mobile telephones. Traditionally, in output RF spectrum analysis techniques, a swept tuned analyzer is used in zero span mode to make measurements, relying on a hardware implemented resolution bandwidth filter (RBW) which may or may not be what is specified in the GSM Standard. The prior art techniques do not provide for any flexibility for a user to use a different filter type. Also, the measurement had to be performed by tuning the analyzer L.O. (Local Oscillator) individually to each offset frequency of the test.

In view of the foregoing, it would be desirable to provide an improved GSM output RF spectrum measurement analyzer and corresponding method.

SUMMARY OF THE INVENTION

It is an object of the present invention to provide an RF spectrum measurement analyzer and method and more particularly to a GSM output RF spectrum measurement analyzer and corresponding method. One preferred embodiment of the present invention is applicable to GSM applications. However, other embodiments could be applicable to the general class of Time Division Multiple Access (TDMA) signals of which GSM, PDC (Pacific Digital Cellular), NASC and the like are a part.

According to one preferred embodiment of the present invention, the method includes the steps of An RF spectrum measurement analyzer method comprising the steps of: acquiring an RF carrier signal; converting the acquired RF carrier signal to an IF signal; converting the IF signal to a digital signal of relatively wide bandwidth; FFT filtering the digital signal to measure multiple offset frequencies within the IF bandwidth; and mathematically applying a resolution bandwidth filter at each offset. A further embodiment includes the steps of inverse FFT filtering the output of the resolution bandwidth filter and measuring the power in the time domain.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
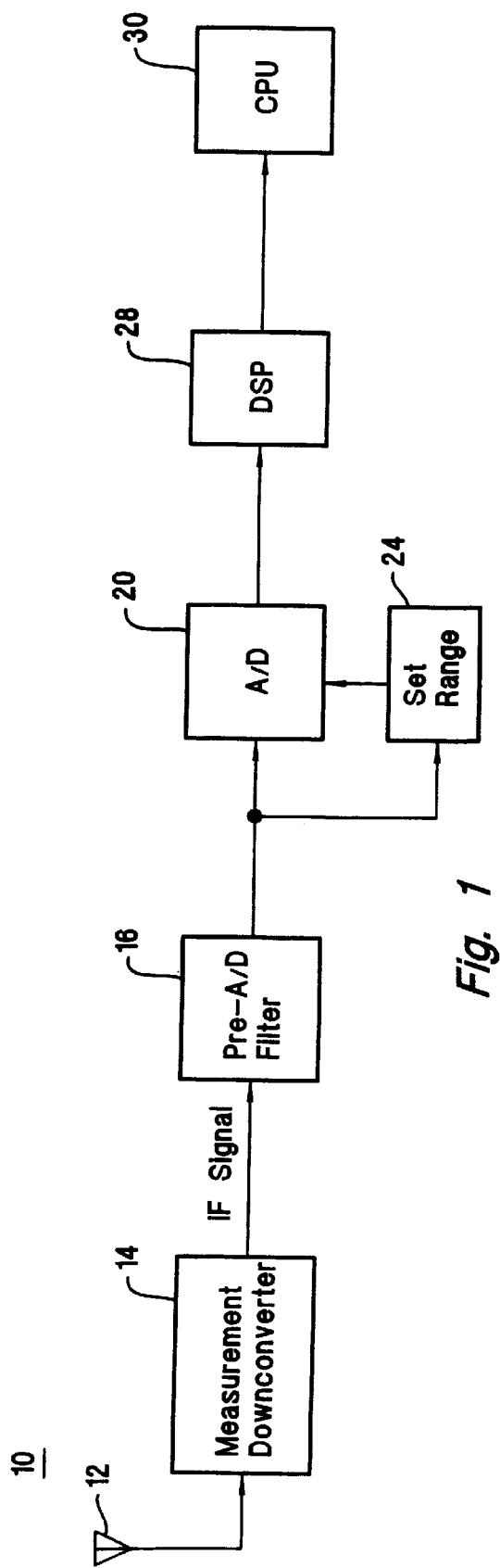
FIG. 1 shows a block diagram of a GSM output RF spectrum measurement analyzer according to the present invention.

Reference will now be made in detail to the preferred embodiments of the invention, examples of which tare illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

In one embodiment, the present invention utilizes a DSP (Digital Signal Processor) with a Hilbert transformer so that the I and Q parts of the signal are acquired and stored at a rate defined by a decimate multiple of 15 MHz. This allows for the easy application of an FFT. However, the resolution bandwidth filter implemented in the DSP is either Gaussian or Flattop. These differ from the GSM Standard specified 5-pole synchronously tuned filter. First, it causes the measurement to be run not per the standard and second, the shape of the filters differ enough to cause erroneous results.

Since an FFT can be utilized easily, one is performed over a wide range, encompassing a bandwidth such that aliasing is avoided and dynamic range is not limited and is within the passband of the DSP IF filter. Software can position a filter shape factor at any offset in the acquired span, then do an inverse FFT (FFT$^{-1}$). With one data acquisition, multiple offsets can be measured in software. This causes the measurement speed to increase because it is not necessary to wait for the L.O. (Local Oscillator) to move for each offset.

Furthermore, since the filter shape factor is applied digitally in software, it can be made to be any shape and width. This allows for a 5 pole synchronously tuned filter as the GSM standard specifies. Also, future enhancements can easily add filter types to the user selections.

In one embodiment, the FFT method is performed with the L.O. tuned to the carrier. The high energy of the carrier causes the ADC to range such that dynamic range is relatively low. Therefore, this method is only performed at offset frequencies whose minimum power levels specified are greater than the dynamic range. The first offset which would be at or less than the required dynamic range can be called the break frequency.

For those offsets less than the break frequency, the FFT method is very fast (roughly half the time as zero span mode). Also, the digital filter shape factor is ideal.

For offsets greater than or equal to the break frequency, a time domain method is used, utilizing a DSP implemented Gaussian Filter. The break frequency is far enough away from the carrier to guarantee a low enough power so that the filtering shape difference between the Gaussian and the 5-pole synch tuned filter does not affect the average power. The IF chain has a pre-ADC filter (pre-filter), in time domain where the L.O. is tuned to each offset, and the carrier is filtered off. This causes the ADC to range up thus increasing the dynamic range.

This present algorithm describes the data acquisition parameters and the data manipulation for the FFT with Direct Time Domain (DTD) method of computing the GSM Output RF Spectrum due to modulation and due to switching transients. The description is for the measurement of multiple timeslot base station signals as well as single timeslot mobile station signals.

Before the measurement loop starts, some initialization must be performed:

Step I1. Verify the DTD Break Frequency is within bounds determined by the following:
   a) No aliasing of FFT offsets. Sampling of the signal causes replication of "spectral islands", or GSM spectrums, centered at frequencies equal to the sample rate. Aliasing adversely affects this measurement if the 1st spectral island above the baseband island is close enough such that the 1st island above baseband has its negative offsets adding to the positive offsets of the baseband island. The below guideline equation determines if the break frequency is too high (values shown are indicative of one possible set):
   Acceptable error due to aliasing=E=5.0%
   Sample rate=fs=1.875 MHz
   Break Frequency=fB=775 kHz
   Aliasing offset=fA
   Max power allowed at fA=PA
   Max power allowed at fB=PM
   Spec of relative difference with carrier at fb=RM
   Total power at fB=PT
   fA=−(fs−fB)=−1.10 MHz
   PA=−27 dBm
   PM=−27 dBm
   RM=−60 dB
   PT=10 Log((10^PA/10)+(10^PM/10))
   e=(PT−PM)/RM
   If e<=E, then fB is allowed, otherwise fB must be reduced.
   b) fB must be within the 3 dB bandwidth of the flattop filter used to acquire the FFT offsets.
   c) In order to measure an offset such that it can meet the specifications for relative power, RM, the dynamic range must be some margin, say 6 dB, better than the specification:
   D.R.>=abs(RM)+margin=DRReqd
   There is a particular dynamic range available for all the FFT offsets=DRFFT. If DRReqd>DRFFT at fB, then fB must be lowered because DRReqd decreases as the offset frequency decreases.

Step I2. Initialize an array of data structures such that each element contains the offset to be measured, its resolution bandwidth, whether it will use the FFT or DTD method as determined by the break frequency parameter, whether the modulation portion of the test is run on this offset, and whether the switching portion of the test is run on this offset. A parameter is stored for the total number of elements in the array, or number of offsets, to be measured. One measurement loop will measure all offsets in this array.

Step 1. The first offset is always 0 Hz, meaning the carrier. If the break frequency is 0 Hz, then the carrier and all of the offsets are measured using the DTD method—skip to Step 13. Otherwise, at least one offset is measured using the FFT method. Acquire a time domain record using adjustable parameters shown below (an example implementation is shown by actual values):
   TaperTime=3.75 usec (used to window the time record prior to FFT—Step 3)
   Length=taperTime+600 usec if modulation only test is running
      taperTime+4.7 msec if modulation & switching or just switching is running
      The length divided by sample rate gives number of samples, which should be made an even power of 2 to improve FFT efficiency
   Analyzer center frequency tuned to channel under test
   IF Filter shape=Flattop
   IF Filter bandwidth=1.55 MHz
   Trigger type=amplitude threshold.

Step 2. Establish a timing reference point, t0, by computing the log-magnitude of the acquired trace, finding where the timeslot edges cross a given threshold to give start and end points, then set t0 to half way between the start and stop points. t0 is now a reference point indicating the center of the timeslot with respect to the trigger point, or origin of the acquired record.

Step 3. Window the time domain record in preparation of the FFT by applying a raised cosine function to the taperTime portions of the record:
   tt=fs * taperTime, where fs is the sample rate of the time record
   For points i=0 to tt, Si=sin ^2( (pi/2)*(i/tt))
   For points i=LastPoint−tt to LastPoint, Si=sin ^2((pi/2)*((LastPoint−i)/tt))
   For all other points Si is unchanged.

Windowing is required because an FFT process assumes that all points repeat circularly forever. Without gradual ramping of the signal to zero at the ends of the record, the discontinuity at those edges looks like a step, which will cause spectral splatter and affect the measurement.

Step 4. Perform FFT on windowed record, S.

Step 5. This step starts the loop for measuring all FFT offsets using the same FFT record obtained in Step 4. For each offset specified in the array of structures established in Step I2, perform this measurement on both the negative offset and the positive offset. Mathematically position a filter centered at the appropriate offset frequency. The bandwidth of this filter is as specified in this particular structure. Though this filter can be any mathematically realizable filter, the GSM standard specifies a 5-pole synch tuned filter. Use the following equation to realize this:

$$|H(\Delta f)| = \left[\frac{1}{\left(\sqrt{\frac{\Delta f}{fo}}\right)^2 + 1}\right]^n$$

$$\angle H(\Delta f) = n \cdot -\tan^{-1}\left(\frac{\Delta f}{fo}\right)$$

$$fo = \frac{RBW/2}{\sqrt{2^{1/n} - 1}}$$

delta−f=frequency at a particular point in the filter with respect to the center frequency of the filter as defined by the offset being measured.

n=number of poles in the filter, in this case 5.

Given the above equations for magnitude and phase of the filter, determine the real and imaginary part for each point in the filter. Do this until delta−f is such that the magnitude of the filter response is −60 dB from the magnitude when delta−f=0.

Perform a complex multiplication of the filter points determined above (60 dB width) with the FFT signal. The result of this filtering is SFILT.

Step 6. Do an inverse FFT of the filter-weighted signal, SFILT.

Step 7. Get the log-magnitude of the inverse FFT signal then remove the points that represent the windowed points in Step 3. Calculate the number of windowed points of this new time record by using the same taperTime established in Step 3. The number of points is different than in Step 3 because the sample rate is now different. The current sample rate is a function of the number of points represented in the 60 dB bandwidth of the filter.

Step 8. Establish a new timing reference point, t0, based on the current time record. This is an adjustment of the t0 established in Step 2 by the ratio of sample rate of this record to the sample rate of the original record. Also adjust it by the ratio of the group delay from the mathematically applied filter to the group delay of the filter used in the original acquisition. The group delay of the original acquisition using a flattop filter is 3.72/BW3 dB. The group delay of the 5-pole synch tuned filter is 0.6137/BW3 dB. The group delay of a Gaussian filter is 1.2806/BW3 dB.

Step 9. Determine a gate time over which the modulation measurement will be performed. t0 calculated in step 8 is the center of the timeslot and the center of the midamble. The start of the gate time must be>=t0+14 bits. One bit is represented in fs/bitRate=fs/270.8333 kbps=samples per bit. The width of the gate must be at least 40 bits in duration and the end point must be<=t0+59 bits.

Step 10. Calculate the absolute RMS or Video power within the gate for the Power Due To Modulation measurement and calculate the peak power over the entire record obtained in Step 7 for the Power Due To Switching Transients. Determine the relative power readings by subtracting these from the absolute power levels calculated at the 0 Hz offset.

Step 10a. For the measurement due to switching transients, compensate the peak power level by a value related to the video bandwidth setting. The standard specifies a VBW to RBW ratio of 1:1 for the Switching portion of the test. This equates to the peak power measured being reduced by 0.188 dB. The VBW to RBW ratio for the modulation test is 3:1; this causes negligible affect on the average power calculated.

Step 11 Go back and repeat Step 5 through Step 10 until both the positive and negative offsets of the given offset value, are determined.

Step 12. Go back and repeat Step 1 through Step 11 until all offset values which are to be measured using the FFT method are determined.

Step 13. This step starts the loop for those offsets to be measured using the DTD method.

Acquire a time domain record using adjustable parameters shown below (an example implementation is shown by actual values):

TaperTime=0.0 usec (no taper needed for DTD method)
Length=taperTime+600 usec if modulation only test is running
  taperTime+4.7 msec if modulation & switching or just switching is running
IF Filter shape=Gaussian
Trigger type=amplitude threshold
Tune the analyzer center frequency to the channel under test+the offset being measured.
Set the Gaussian bandwidth to that which is specified for the offset under test. The GSM standard uses 30 kHz and 100 kHz bandwidths for all offsets. If one of these is used, i.e., this is not a custom bandwidth setting, then increase the bandwidth so that the equivalent noise bandwidth (ENB) of the Gaussian filter matches the ENB of a 30 kHz or 100 kHz 5-pole synch tuned filter.

Step 14. Given the time record acquired in Step 13, perform Steps 7 through 10 to determine the power levels for modulation and switching portions.

Step 15. Repeat Steps 13 and 14 so that both the positive and negative offsets are measured.

Step 16. Repeat Step 13 through Step 15 until all offset values which are to be measured using the DTD method are determined.

Now that a detailed description of the algorithm according to the present invention has been provided, a detailed description of the apparatus implementing the features of the present invention will be provided in conjunction with FIGS. 1–4.

FIG. 1 shows a block diagram of a GSM output RF spectrum measurement analyzer 10 according to the present invention. In FIG. 1, antenna 12 provides an RF signal to measurement downconverter 14, which in turn provides an IF signal to Pre-A/D filter 16. Filter 16 provides an input to ADC 20 and set range 24. ADC 20 provides an input to DSP 28, which in turn provides an input to CPU 30.

Figure 2:
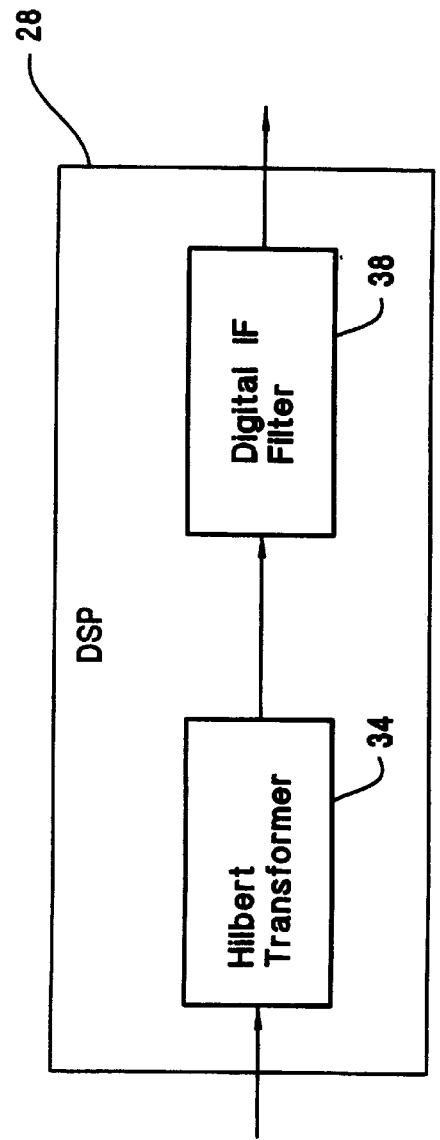
FIG. 2 shows a block diagram of a digital signal processor (DSP), which forms a portion of FIG. 1.

FIG. 2 shows a block diagram of the digital signal processor (DSP) 28, which forms a portion of FIG. 1. The ADC 20 of FIG. 1 provides an input to Hilbert Transformer 34 in FIG. 2, which provides an input to Digital IF Filter 38.

Figure 3:
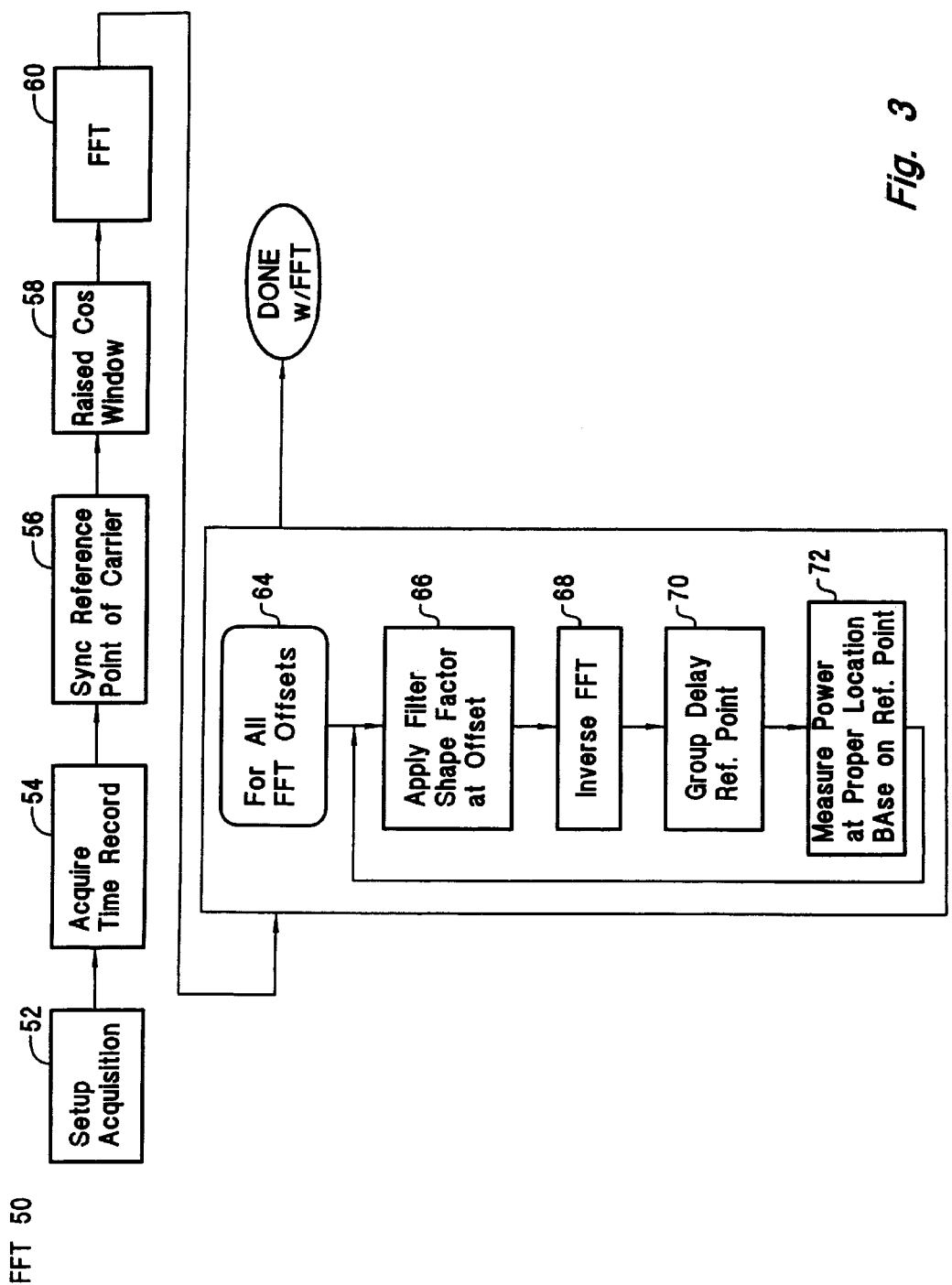
FIG. 3 shows a block diagram of a FFT algorithm which forms a portion of FIG. 1.

FIG. 3 shows a block diagram of a FFT algorithm which forms a portion of FIG. 2. Setup Acquisition occurs at stage 52, and Acquire Time Record occurs at stage 54. Sync Reference Point of Carrier occurs at stage 56, and Raised Cos Window occurs at stage 58. The FFT portion begins at stage 60. For all FFT Offsets at stage 64, the Apply Filter Shape Factor at Offset occurs at stage 66; an Inverse FFT occurs at stage 68; the Group Delay Reference Point occurs at stage 70, and the Measure Power at Proper Location Based on Reference Point occurs at stage 72.

Figure 4:
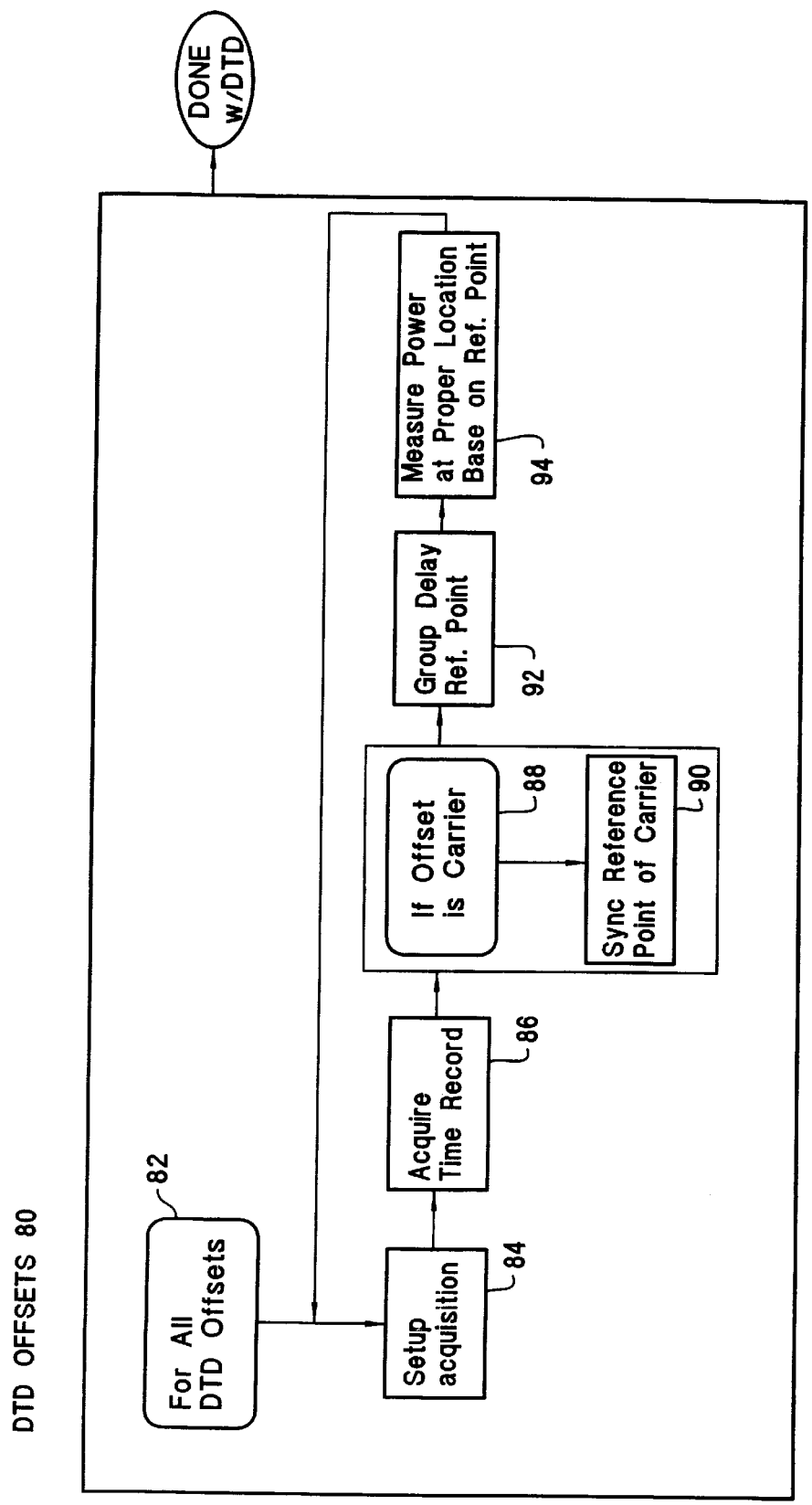
FIG. 4 shows a block diagram of a DTD algorithm, which forms a portion of FIG. 1.

FIG. 4 shows a block diagram of a DTD (Direct Time Domain) algorithm 80, which forms a portion of FIG. 1. For All DTD Offsets 82, the Setup Acquisition occurs at stage 84; the Acquire Time Record occurs at stage 86; If Offset is Carrier occurs at stage 88; the Sync Reference Point of Carrier occurs at stage 90; the Group Delay Reference Point occurs at stage 92; and the Measure Power at Proper Location Based on Reference Point occurs at stage 94.

Referring to FIG. 1, with no pre-A/D filter 16 (infinite bandwidth), the entire IF bandwidth of the IF signal is hitting the A/D converter (ADC) 20. The ADC 20 gain is set based on the peak level at its input, as determined by the "Set Range" block 24. The dynamic range (noise floor) of the ADC 20 is dependent on the gain selected.

For the type of signals being measured, the highest energy within the IF bandwidth is at the carrier. Therefore, the lowest dynamic range (highest noise floor) of the ADC 20 occurs when the full energy of the carrier is input to the ADC 20.

All offsets measured using the FFT method 50 shown in FIG. 3 are done so with the analyzer tuned such that the carrier is at the center of the IF bandwidth. Therefore, the dynamic range of the offsets measured using the FFT method 50 is the same as that for the carrier. The dynamic range requirement generally increases as the offset frequency increases. If the dynamic range requirement exceeds what is available by the FFT method 50, the direct time domain method 80 shown in FIG. 4 utilizing the pre-ADC filter 16 of FIG. 1 is used.

For the direct time domain method 80 shown in FIG. 4, the analyzer center frequency is tuned to the carrier frequency of interest plus the offset frequency. The pre-ADC filter 16 of FIG. 1 is set to be centered at the same frequency as the analyzer and its bandwidth is set 2.5 times wider than the Digital IF Filter 38 (shown in FIG. 2) bandwidth. The high energy carrier is now some offset away from the center of the pre-ADC filter 16 so that it is getting attenuated by the filter 16. This attenuation now causes less energy input to the ADC 20, thus allowing it to increase the gain and with it the dynamic range.

For large offsets (>1 MHz), the signal input to the ADC 20 is very small and the dynamic range is maximized.

Referring to FIG. 3, a time record is acquired at stage 54 with the analyzer's center frequency set to the RF Channel under test, pre-ADC filter 16 is not connected, and the digital IF filter 38 shape is Flattop. The digital IF filter 38 bandwidth is set wide enough to include the maximum FFT selected offset from the carrier at stage 66.

The Output RF Spectrum Due to Modulation test is performed by measuring the power over the 50% to 90% portion of the burst. A timing reference point on the burst is required to determine where the 50% and 90% points are. This reference is calculated from the data acquisition of the carrier obtained above. (There are multiple methods of determining the reference point which can be selected by the user.)

In order to accurately obtain the frequency domain spectrum from the FFT, the time record must be windowed. The windowing function smoothly tapers the ends of the time record down to zero. The window function is: $\sin{}^{\wedge}2((pi/2)*(x/windowLength))$.

At stage 60, an FFT is performed on the time record to obtain the frequency domain spectrum. Depending on the width of the digital IF filter used in the data acquisition, the spectrum contains the energy from multiple offsets of interest. Therefore, with the one spectrum obtained, power from multiple offsets can be measured by mathematically applying a filter around an offset.

Starting at stage 64, the FFT method mathematically positions the required filter around the frequency corresponding to the offset to be measured. The GSM standards specify this filter shape to be a 5-pole synchronously tuned filter; however, since the filter is applied mathematically, this method allows usage of any filter shape without modifying the hardware configuration. The next step is to multiply the filter shape by the spectrum data points, including all points which fall inside of the 60 dB bandwidth of the filter.

The next stage 68 is to obtain the inverse FFT on the filtered points to get back the time record. This time record now only contains elements of the spectrum passed by the filter above.

At stage 70, the FFT method determines the 50% and 90% points of the time record by adjusting the reference point from the carrier by the appropriate group delay of the mathematical filter and at stage 72, the FFT method measures the power, as specified, on the time record.

Referring now to FIG. 4, the Direct Time Domain (DTD) 80 block diagram is shown. The direct time method is performed by tuning the analyzer so that the center frequency of the analyzer is at the offset to be tested, i.e., no other offset can be measured with this one data acquisition.

At stage 86, a time record is acquired with the analyzer's center frequency set to the RF Channel under test plus the offset under test, pre-ADC filter is set to 2.5 times the digital IF filter bandwidth, and the digital IF filter shape is Gaussian. If this test is per the GSM standard, the filter to be used is specified as a 5-pole synchronously tuned filter. This is a slightly different shape than a Gaussian. In order not to require hardware changes to the digital IF filter, some adjustments are made to the Gaussian filter bandwidth. The bandwidth is set so that its impulse bandwidth and noise bandwidth match that of a 5-pole synchronously tuned filter. The shape of the resultant waveform will not be extremely accurate, but this DTD method is intended for offsets relatively far away from the carrier and their amplitude is sufficiently low enough that the shape discrepancy is negligible. Since the impulse and noise bandwidths are adjusted, the integrated power result is accurate.

The Output RF Spectrum Due to Modulation test is performed at stage 94 by measuring the power over the 50% to 90% portion of the burst. A timing reference point on the burst is required to determine where the 50% and 90% points are (there are multiple methods of determining the reference point which can be selected by the user.) If the above acquisition is the carrier (0 Hz offset), the reference point is obtained from this acquisition.

For all acquisitions of offsets that are not the carrier, the reference point is adjusted from the carrier by the appropriate group delay of the Gaussian filter. At stage 94, the DTD method measures the power, as specified, on the time record.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. For example, one preferred embodiment is applicable to GSM applications. However, other embodiments could be applicable to the general class of Time Division Multiple Access (TDMA) signals of which GSM, PDC (Pacific Digital Cellular), NADC and the like are a part. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An RF spectrum measurement analyzer method comprising the steps of:
   acquiring an RF carrier signal;
   converting the acquired RF carrier signal to an IF signal;
   converting the IF signal to a digital signal of relatively wide bandwidth;
   FFT filtering the digital signal to measure multiple offset frequencies within the IF bandwidth;
   mathematically applying a resolution bandwidth filter at each offset; and
   inverse FFT filtering the output of the resolution bandwidth filter and measuring power at each offset frequency in the time domain.

2. The method as in claim 1 including the steps of acquiring the RF signal with the analyzer tuned to an offset frequency away from the carrier and filtering away the carrier before conversion to the digital signal.

3. The method as in claim 2 including the step of digitally applying a Gaussian resolution bandwidth filter which is set such that the equivalent bandwidth matches that of a specified tuned filter to a signal in the time domain.

4. An RF spectrum analyzer comprising:
   means for acquiring an RF carrier signal;
   means for converting the acquired RF carrier signal to an IF signal;
   means for converting the IF signal to a digital signal of relatively wide bandwidth;
   means for FFT filtering the digital signal to measure multiple offset frequencies within the IF bandwidth;

means for mathematically applying a resolution bandwidth filter at each offset;

means for inverse FFT filtering the output of the resolution bandwidth filter; and means for measuring power at each offset frequency in the time domain.

5. The analyzer as in claim 4 including means for acquiring the RF signal with the analyzer tuned to an offset frequency away from the carrier and means for filtering away the carrier before conversion to the digital signal.

6. The analyzer as in claim 5 including means for digitally applying a Gaussian resolution bandwith filter which is set such that the equivalent bandwidth matches that of a specified tuned filter to a signal in the time domain.

7. The analyzer as in claim 6 wherein the specified tuned filter is a 5-pole synchronously tuned filter.

8. A radio frequency (RF) spectrum analyzer method comprising the steps of:

transforming an RF signal to yield a digital signal;

Fourier transforming said digital signal to yield a relatively wide-band frequency distribution;

mathematically applying resolution bandwidth filters to said frequency distribution to yield relatively narrow-band frequency distributions; and applying inverse Fourier transforms to each narrow-band frequency distribution to yield a time-domain signal; and determining a power associated with each time-domain signal.

9. A method as recited in claim 8 wherein said transforming step involves converting said RF signal to an intermediate frequency (IF) signal, and digitizing said IF signal.

* * * * *